(12) United States Patent
Jiang et al.

(10) Patent No.: US 7,807,532 B2
(45) Date of Patent: Oct. 5, 2010

(54) METHOD AND STRUCTURE FOR SELF ALIGNED FORMATION OF A GATE POLYSILICON LAYER

(75) Inventors: Li Jiang, Shanghai (CN); Ying Shao, Shanghai (CN); Libbert Peng, Shanghai (CN); Auter Wu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 555 days.

(21) Appl. No.: 11/623,048

(22) Filed: Jan. 12, 2007

(65) Prior Publication Data
US 2007/0243685 A1    Oct. 18, 2007

(30) Foreign Application Priority Data
Apr. 12, 2006    (CN) .................. 2006 1 0025646

(51) Int. Cl.
H01L 21/336    (2006.01)
(52) U.S. Cl. ................ 438/264; 438/296; 257/E21.422
(58) Field of Classification Search ................ 438/263, 438/264, 296; 257/E21.422
See application file for complete search history.

(56) References Cited

U.S. PATENT DOCUMENTS

| | | | |
|---|---|---|---|
| 5,872,055 A | 2/1999 | Jenq et al. | |
| 6,008,112 A * | 12/1999 | Acocella et al. | 438/593 |
| 6,700,143 B2 | 3/2004 | Tuan et al. | |
| 6,746,918 B2 * | 6/2004 | Wu | 438/257 |
| 6,924,220 B1 | 8/2005 | Yang et al. | |
| 2003/0153189 A1 | 8/2003 | Ko et al. | |
| 2003/0216003 A1 | 11/2003 | Lee et al. | |
| 2005/0106835 A1 | 5/2005 | Layadi et al. | |

* cited by examiner

*Primary Examiner*—Chandra Chaudhari
(74) *Attorney, Agent, or Firm*—Townsend and Townsend and Crew LLP

(57) ABSTRACT

A method for processing semiconductor devices includes providing a semiconductor substrate. The method includes forming a pad oxide layer overlying the substrate and forming a silicon nitride layer overlying the pad oxide layer. The method includes forming a trench region extending through an entirety of a portion of the silicon nitride layer and extends into a depth of the semiconductor substrate. The method also includes filling the trench region with an oxide material. The oxide material extends from a bottom portion of the trench region to an upper surface of the silicon nitride layer. The method includes planarizing the oxide material and selectively removing the silicon nitride layer to form an isolation structure. A polysilicon material is deposited overlying the isolation structure. The polysilicon material is planarized to expose a top portion of the isolation structure and form a first electrode and a second electrode structures separated by a portion of the isolation structure.

6 Claims, 17 Drawing Sheets

METHOD AND STRUCTURE FOR SELF ALIGNED FORMATION OF A GATE POLYSILICON LAYER

CROSS-REFERENCES TO RELATED APPLICATIONS

This application claims priority to Chinese Application No. 200610025646.0; filed on Apr. 12, 2006; commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and structures for manufacturing gate structures for NOR flash memory integrated circuit devices, commonly called Flash devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed.

An example of such a process is the fabrication of gate structures for memory devices. Although there have been significant improvements, such method still have many limitations. As merely an example, as these device designs become smaller and smaller, challenges exists in current lithography and etch processes. Additionally, these gate designs are often difficult to manufacture and generally require complex manufacturing processes and structures, which lead to inefficiencies and may cause low device yields from leakages. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuit are provided. More particularly, the invention provides a method and structures for manufacturing gate structures for NOR flash memory integrated circuit devices, commonly known as Flash devices. But it would be recognized that the invention has a much broader range of applicability. For example, the invention can be applied to a variety of devices such as dynamic random access memory devices, static random access memory devices, application specific integrated circuit devices, microprocessors, microcontrollers, and others.

In a specific embodiment, the invention provides a method for processing semiconductor devices. The method includes providing a semiconductor substrate, which comprises a surface region. The semiconductor substrate can be silicon, silicon on insulator, epitaxial silicon or the like. The method includes forming a pad oxide layer overlying the surface region. The pad oxide layer has a pad oxide surface region. The method includes forming a silicon nitride layer overlying the pad oxide layer. The method includes forming a trench region. Preferably, the trench region extends through an entirety of a portion of the silicon nitride layer and extends into a depth of the semiconductor substrate. The method also includes filling the trench region with an oxide material using a plasma deposition process. The oxide material extends from a bottom portion of the trench region to a vicinity of an upper surface region of the silicon nitride layer. The method includes planarizing the oxide material and exposing a surface of the silicon nitride layer. The method includes selectively removing the silicon nitride layer to cause formation of an isolation structure. The isolation structure extends from the bottom portion of the trench region to a height above a the pad oxide surface region. The method includes stripping the pad oxide layer and forming a tunnel oxide structure overlying a portion of the semiconductor substrate. The method also includes depositing a conformal layer of polysilicon material overlying the isolation structure and the tunnel oxide structure. Next, the method includes planarizing the polysilicon material to expose a top portion of the isolation structure and form a first electrode structure and a second electrode structure separated by a portion of the isolation structure Many benefits are achieved by way of the present invention over conventional techniques. For example, the present technique provides an easy to use process that relies upon conventional technology. In some embodiments, the method provides means to reduce process steps and higher device yields in dies per wafer. Additionally, the method provides a process that is compatible with conventional equipment and processes. Preferably, the method can be applied to a variety of applications such as memory, application specific integrated circuit, microprocessor, and others. Particularly, the invention provides a method to fabricate gate structures for integrated circuit devices. Depending on the embodiment, one or more of these benefits may be achieved. These and other benefits are described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to present invention, techniques including method for manufacturing of semiconductor devices are provided. More particularly, the invention provides a method for fabricating gate structures for memory devices. But it would be recognized that the invention has a much broader range of applicability. For example, the invention can be applied to application specific integrated circuit devices, logic devices, and others.

Figure 1A:
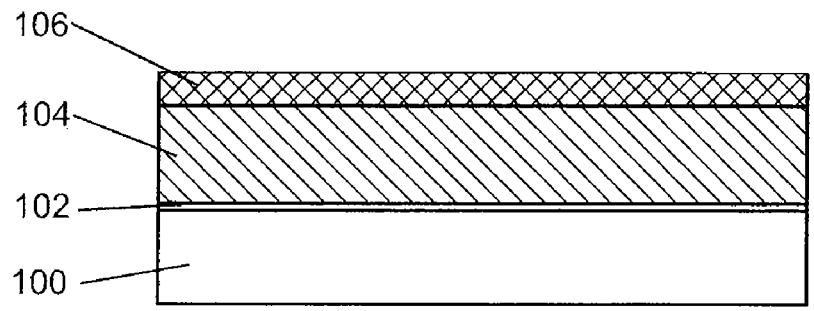
FIG. 1(a) through 1(p) are simplified diagrams illustrating a conventional method of manufacturing an integrated circuit.
Figure 1B:
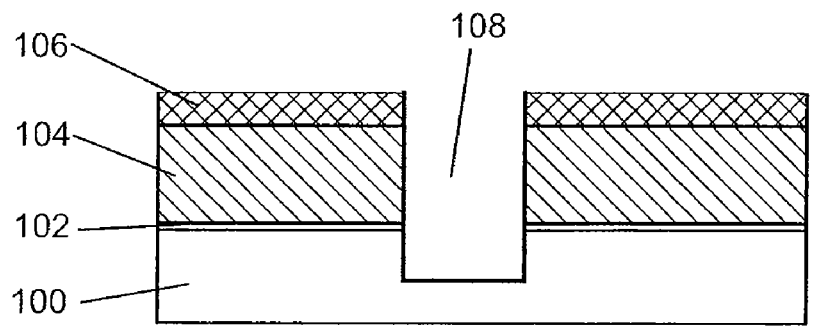
Figure 1C:
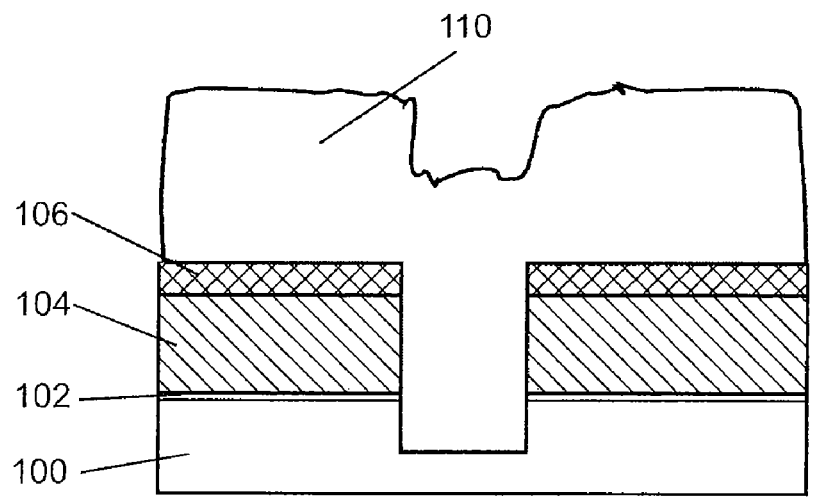

FIG. 1(a) to 1(q) are simplified diagrams illustrating a conventional method of fabricating gate structures for integrated circuit devices. As shown in FIG. 1(a), the conventional method includes providing a semiconductor substrate 100 having a surface. A dielectric stack is formed overlying the semiconductor substrate. The dielectric stack often comprises of silicon oxide 102, silicon nitride 104, and silicon oxynitride 106. The dielectric stack and a portion of the semiconductor substrate is subjected to a first masking and etch process to form a trench region 108 as shown in FIG. 1(b). An oxide material 110 is deposited overlying the dielectric stack and filling the trench region 108 as shown in FIG. 1(c). The oxide material is usually silicon oxide formed using a high density plasma process.

Figure 1D:
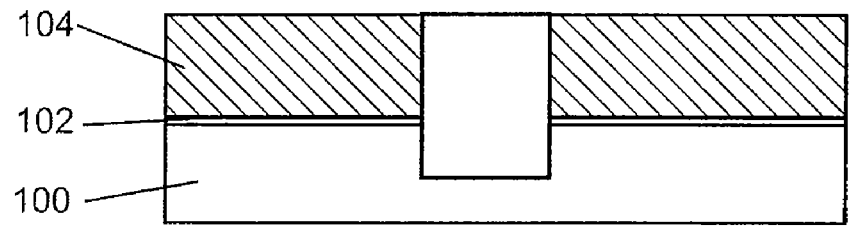
Figure 1E:
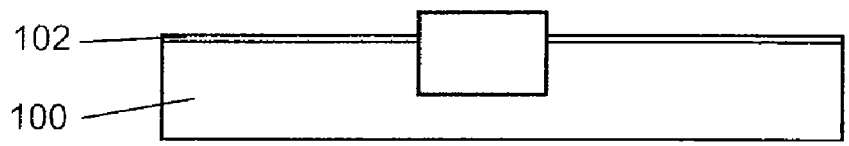
Figure 1F:
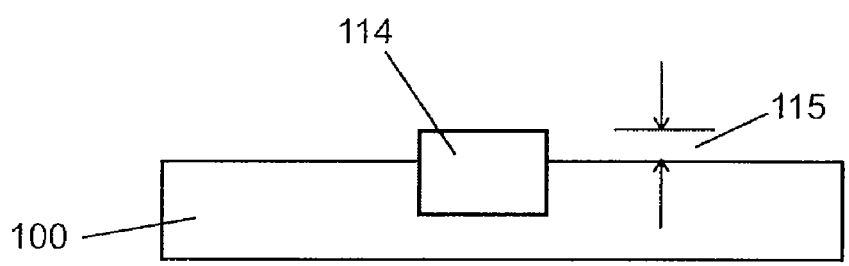
Figure 1G:
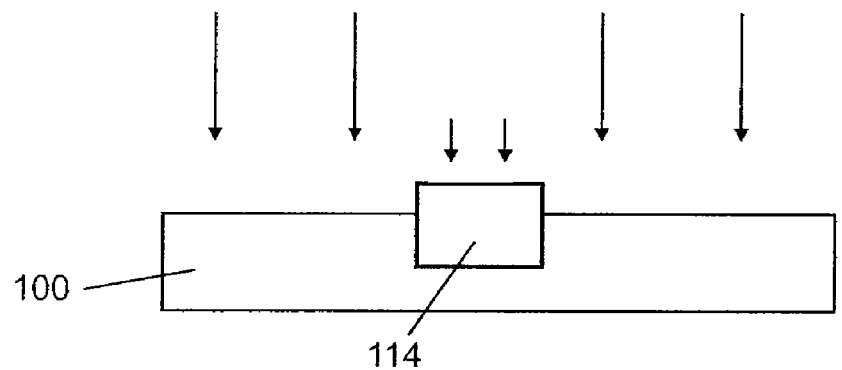

As shown in FIG. 1(d), the dielectric stack and the oxide material is planarized using a chemical mechanical polishing process exposing a top surface of the isolation region. The top surface of the isolation region is even with silicon nitride layer 104. As shown in FIG. 1(e), a first selective etching process removes silicon nitride and shown in FIG. 1(f), a second etching process removes silicon oxide, forming an isolation region 114. The isolation region has a height of about 250 Å from the surface of the semiconductor substrate. An implant process provides source/drain regions and a channel regions in the semiconductor substrate as shown in FIG. 1(g).

Figure 1H:
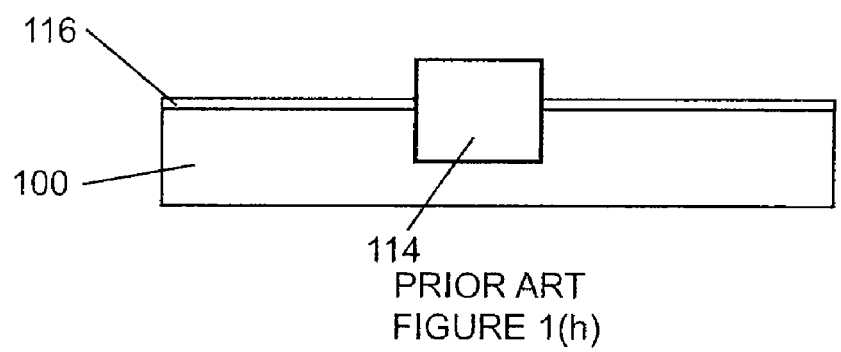
Figure 1I:
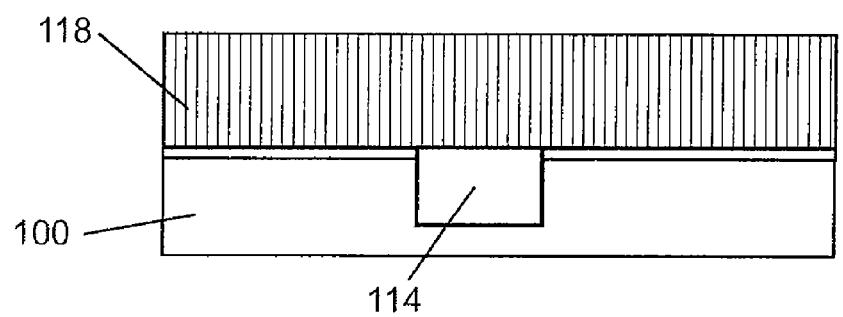

As shown in FIG. 1(h), the conventional method includes forming a tunnel oxide 116 overlying the semiconductor substrate. A polysilicon material 118 is deposited overlying the tunnel oxide and isolation region 114 as shown in FIG. 1(i).

Figure 1J:
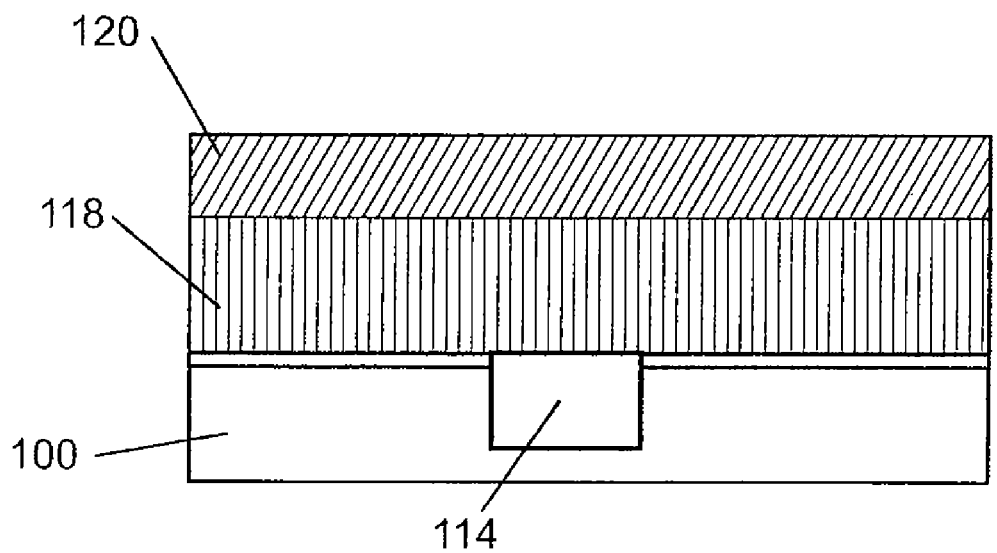
Figure 1K:
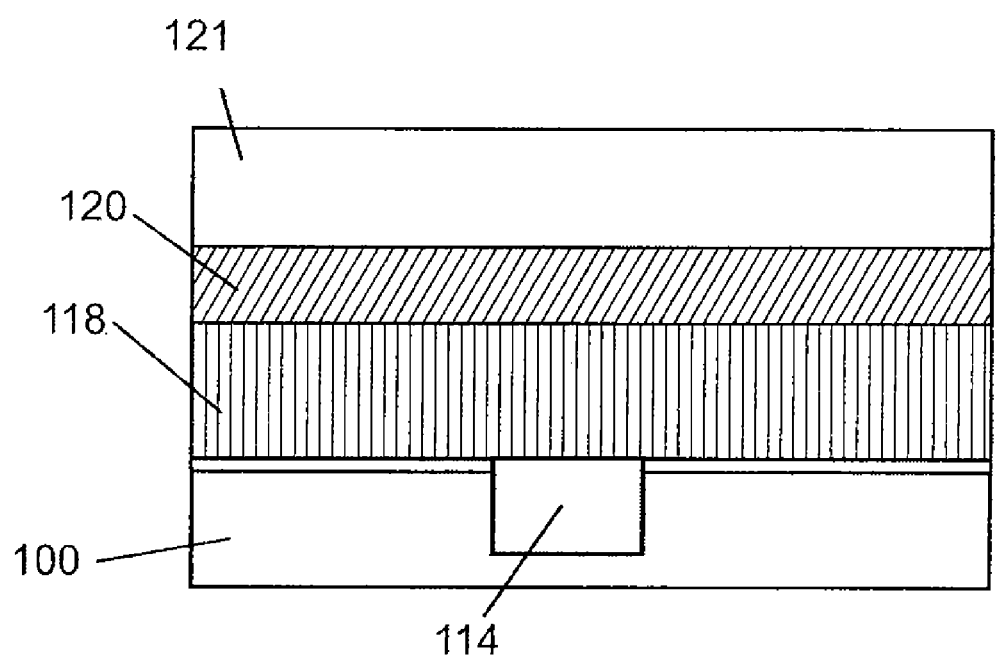
Figure 1L:
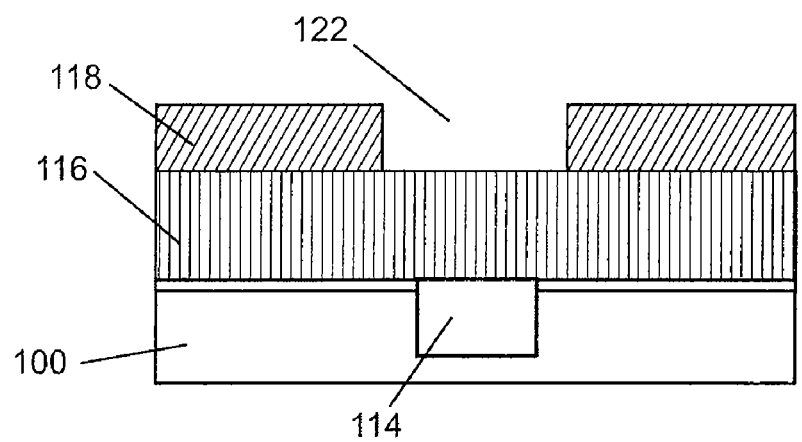
Figure 1M:
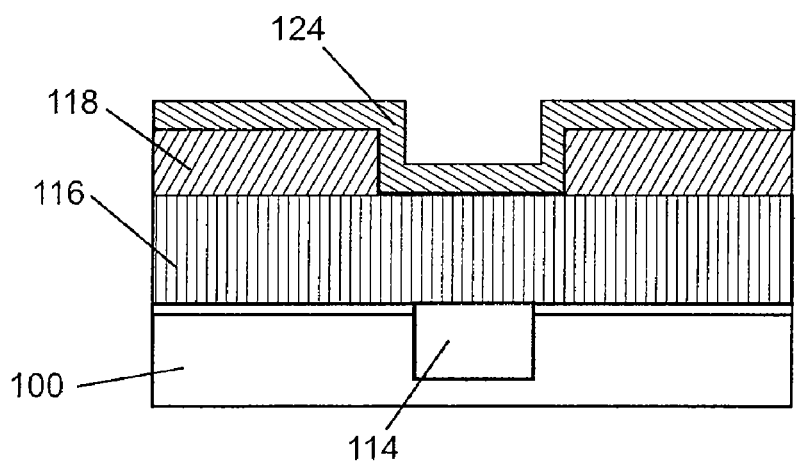
Figure 1N:
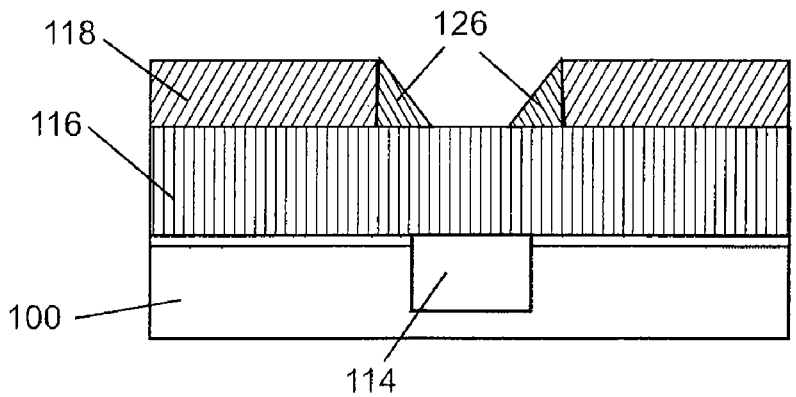
Figure 1O:
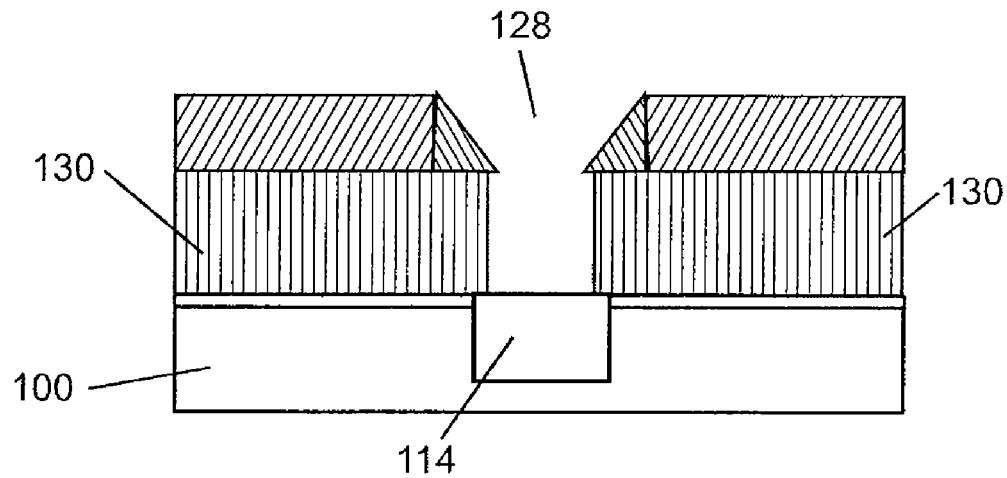
Figure 1P:
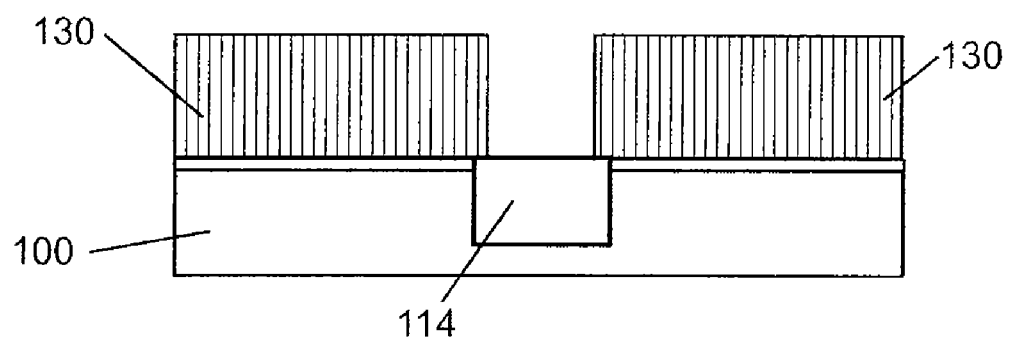

A silicon nitride layer 120 is formed overlying polysilicon material 118 as shown in FIG. 1(j). A photoresist material is formed overlying the silicon nitride layer 120 as shown in FIG. 1(k). A second pattern and selective etch process form an opening 122 in the silicon nitride layer as shown in FIG. 1(l). The opening 122 is aligned to form above the isolation structure 114. Shown in FIG. 1(m), a third silicon nitride layer 124 is formed conformally overlying the second silicon nitride layer including the opening 122. The third silicon nitride layer is subjected to a pattern and etch process to form spacer structure 126 as shown in FIG. 1(n). The polysilicon material 116 is etched using the third silicon nitride layer and the second silicon nitride layer as a hard mask to form gate structures as shown in FIG. 1(o). A selective etching process removes the spacer structure and the second silicon nitride layer forming gate structures 130 separated by the isolation structure 114 as shown in FIG. 1(p).

Certain limitations exist with this conventional method for forming gate structures in integrated circuit devices. For example, for technology node of 0.18 μm and below, misalignment in patterning silicon nitride hard mask 122 to the isolation structure, and misalignment in silicon nitride spacer 126 in gate structure formation often cause defect leading to leakage and device failure. These and other limitations of conventional method for forming gate structures can be found throughout the present specification. Further details of overcoming limitations of conventional method of forming gate structures are found throughout the specification and particularly below.

A method for fabricating a gate structure for integrated circuit devices according to an embodiment of the present invention may be outlined as follows:

1. Provide a semiconductor substrate, e.g., silicon wafer, silicon on insulator, or epitaxial silicon.
2. Deposit a high density plasma silicon oxide layer filling the trench region and over a surface of the silicon nitride layer.
3. Planarize the high density plasma silicon oxide layer using a chemical mechanical polishing process forming a trench region and exposing silicon nitride layer.
4. Selectively remove the silicon nitride layer by a wet etch process, forming an isolation structure extending from bottom of the trench region and having a height above the pad oxide layer.
5. Remove the pad oxide layer and a portion of the high density plasma silicon oxide layer in the trench region.
6. Implant source drain regions and a channel region in the semiconductor substrate using the high density plasma silicon oxide layer in the trench region as a mask.
7. Form tunnel oxide.
7. Deposit a polysilicon material.
8. Deposit a cap oxide material.
9. Planarize the polysilicon material exposing a top portion of the isolation structure.
10. Form polysilicon gate structures by remove a portion of the high density plasma silicon oxide in the trench region using a HF dip process.

The above sequence of steps provides a method for fabricating gate structure for integrated circuit device according to an embodiment of the present invention. As shown, the method uses a combination of steps including a way of forming a gate structure using a self-align gate formation technique. Other alternatives can also be provided where steps are added, one or more steps are removed or one or more steps are provide in a different sequence without departing from the scope of the claims herein. Further details of the present invention can be found throughout the present specification and more particularly below.

Figure 2A:
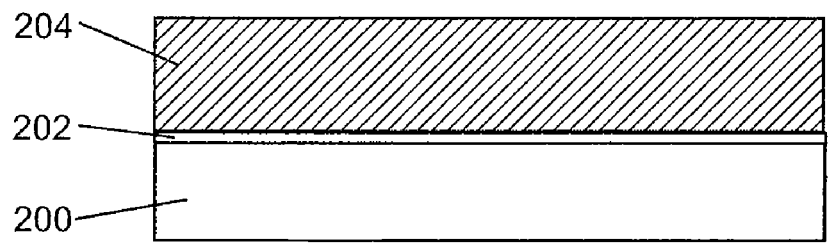
FIG. 2(a) through 2(k) are simplified diagrams illustrating a method of manufacturing an integrated circuit according to an embodiment of the present invention.

FIG. 2(a)-2(k) are a simplified diagrams illustrating a method for fabricating a gate structure according to an embodiment of the present invention. The diagrams are merely examples which should not unduly limit the scope of the claims herein. One of ordinary skill in the art would recognize many variations, alternatives, and variations. In a specific embodiment, the present invention provides a method for forming a gate structure for integrated circuit devices. As shown in FIG. 2(a), the method includes providing a semiconductor substrate 200 having a surface. The semiconductor substrate can be silicon wafer, silicon on insulator, epitaxial silicon, or the like. The method includes forming a pad oxide 202 overlying the semiconductor substrate.

The pad oxide can be a thermal oxide. The pad oxide can also be deposited using a chemical vapor deposition process or other suitable processes. A silicon nitride layer 204 is formed overlying pad oxide layer 202. The silicon nitride layer can be formed using a chemical vapor deposition process using dichlorosilane and $NH_3$ as precursors. Other suitable process such as a plasma enhanced chemical vapor deposition may also be used depending on the application.

Figure 2B:
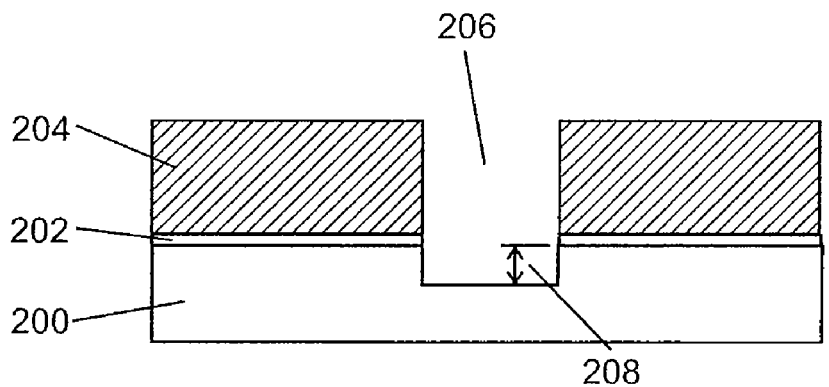

As shown in FIG. 2(b), a trench region 206 is formed using a pattern and etch process. A reactive ion etching process can be used. Other etching techniques such as wet etch may also be used depending on the application. The trench region 206 extends through an entire thickness of silicon nitride layer and to a depth 208 in the semiconductor substrate. The depth 208 ranges from 2000 Å to 4500 Å in certain embodiments.

Figure 2C:
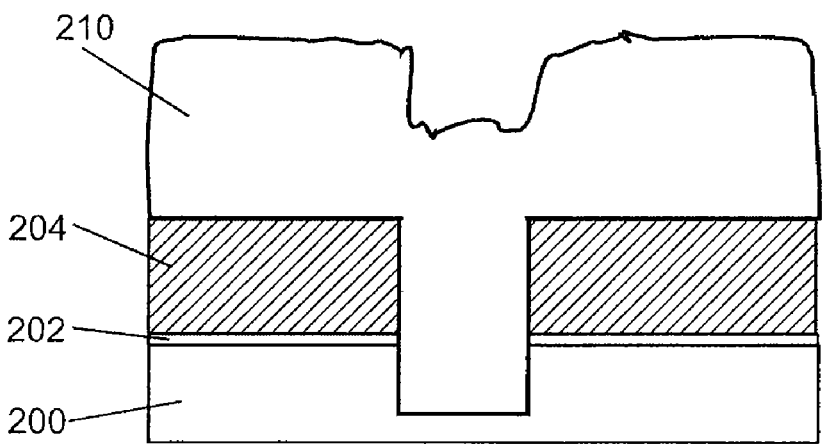

The method includes depositing an oxide material 210 overlying the silicon nitride layer and filling the trench region 206 as shown in FIG. 2(c). In a preferred embodiment, the oxide material comprises of silicon oxide deposited using a high density plasma (HDP) process using precursors such as silane and oxygen in an argon ambient. Other suitable precursors may also be used. Other suitable deposition process such as low pressure chemical vapor deposition, (LPCVD), plasma enhanced chemical vapor deposition (PECVD) may also be used.

Figure 2D:
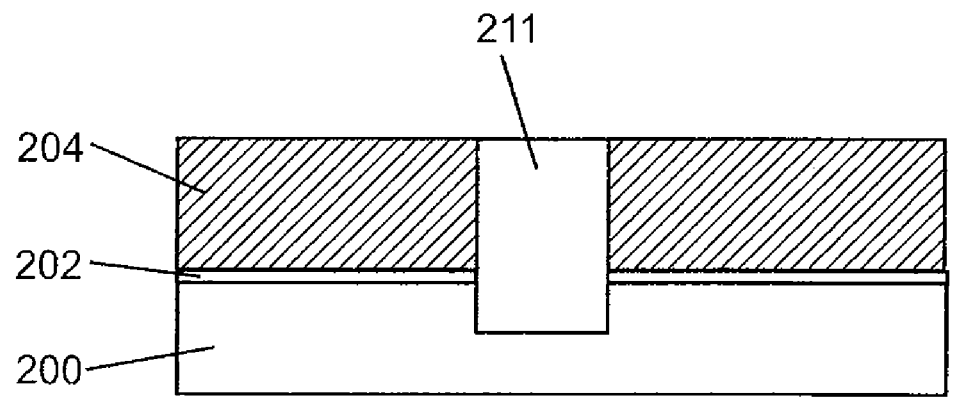

As shown in FIG. 2(d), the method includes planarizing the oxide material, exposing a surface of the silicon nitride layer and a top surface of the oxide material in the trench region 211 using a planarizing process. As shown, the top surface of the oxide material is substantially level and even with the patterned nitride layer. In a specific embodiment, a chemical mechanical polishing process can be used for the planarizing process. As an example, the chemical mechanical polishing process uses a high selectivity chemical mechanical polishing process and the nitride layer as a stop (e.g., a polish stop). Other suitable planarizing process may also be used. These other techniques can include etch back, reflow, and/or other combinations. As shown, the silicon nitride layer remains at a thickness ranges from 1500 to 2000 Å in cell region. Of course, there can be other variations, modifications, and alternatives.

Figure 2E:
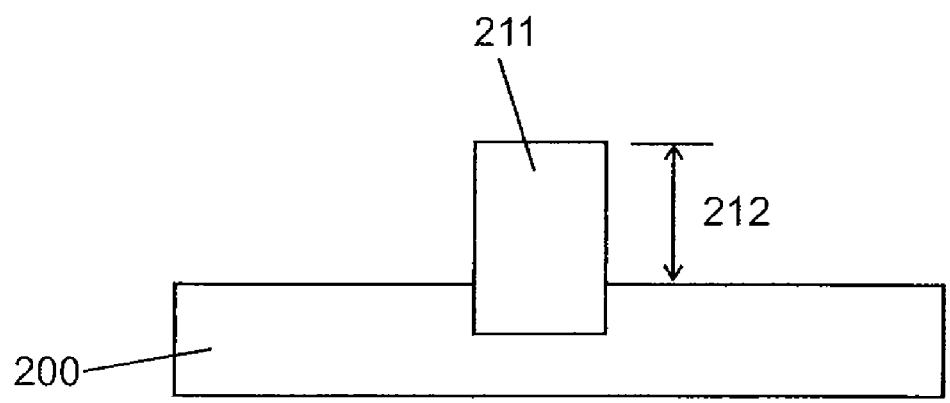

FIG. 2(e) illustrates the formation of an isolation structure 213 according to an embodiment of the present invention. A selective silicon nitride etch process removes the silicon nitride layer, an oxide strip process removes the pad oxide layer and a portion of the oxide material, exposing the oxide material to a height of 212 above the surface of the semiconductor substrate as shown in FIG. 2(e). In a specific embodiment, a wet etch using phosphoric acid species is used for the selective silicon nitride etch process. Other selective silicon nitride etch process such as reactive ion etching (RIE) may also be used. The oxide strip process uses an aqueous hydrofluoric acid species. Other suitable oxide strip process such as reactive ion etching (RIE) may also be used. The height 212 ranges from 1000 to 2000 Å in certain embodiment. Of course, one of ordinary skill in the art would recognize many other variations, modifications, and alternatives.

Figure 2F:
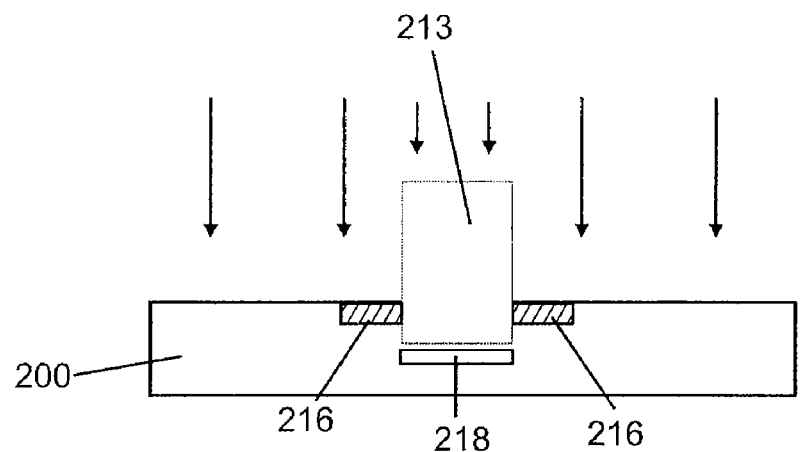

As shown in FIG. 2(f), the method includes forming source/drain regions 216 and a channel region 218 using an implantation process. The implantation process includes using boron as dopants at a dose of $1.4 \times 10^{13}$ to $1.6 \times 10^{13}$ atoms per $cm^2$ and at an energy of 75 keV to 85 keV. Other implant parameters may also be used depending on the application.

Figure 2G:
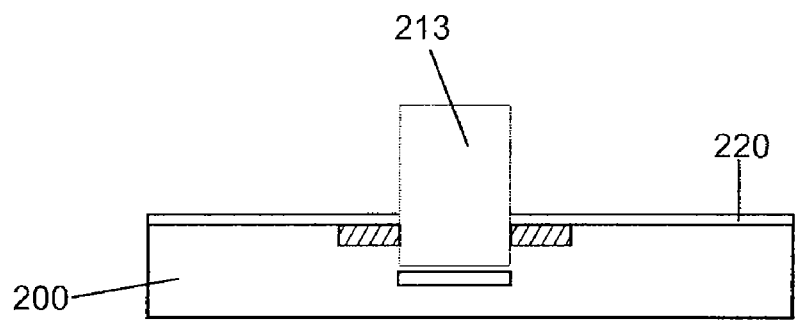

The method includes forming a tunnel oxide 220 overlying the semiconductor substrate as shown in FIG. 2(g). The tunnel oxide can be formed using a chemical vapor deposition process using tetraethyl orthosilicate as precursor. Other suitable silicon oxide deposition process may also be used. These other processes include low pressure chemical vapor deposition process using dichlorosilane (DCS) and oxygen as precursors, plasma enhanced chemical vapor deposition (PECVD), among others. Alternatively, the tunnel oxide can be formed using a oxide growth process.

Figure 2H:
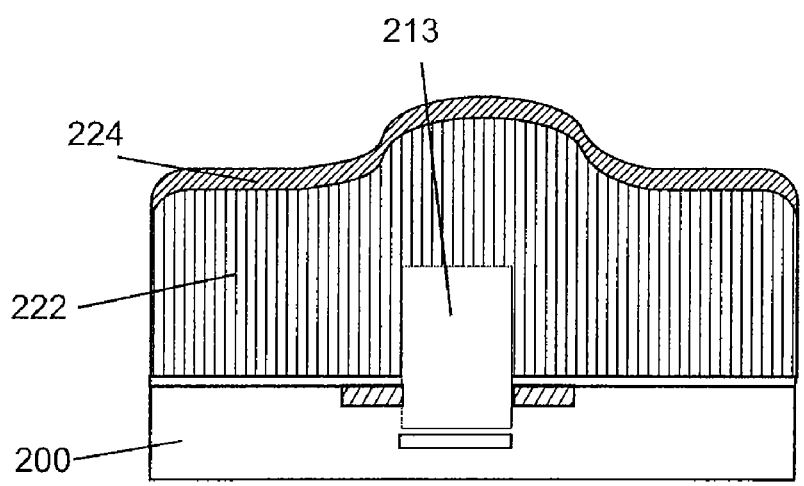

The method includes depositing a conformal layer of polysilicon material 222 overlying the isolation structure and the tunnel oxide s shown in FIG. 2(h). The polysilicon material is formed using a chemical vapor depositing process and silane as precursor in a specific embodiment. Also shown in FIG. 2(h), a cap oxide layer 224 is formed overlying the conformal polysilicon material. The cap oxide layer is formed using a low pressure chemical vapor deposition process and dichlorosilane (DCS) and oxygen as precursors. Other precursors such as tetraethyl orthosilicate (TEOS) or silane and oxygen may also be used. Other deposition processes such as plasma enhanced chemical vapor deposition may also be used. The cap oxide layer protects the polysilicon material during chemical mechanical polishing by preventing delamination of the polysilicon material. The cap oxide layer also protects large polysilicon area and reduces polysilicon dishing.

Figure 2I:
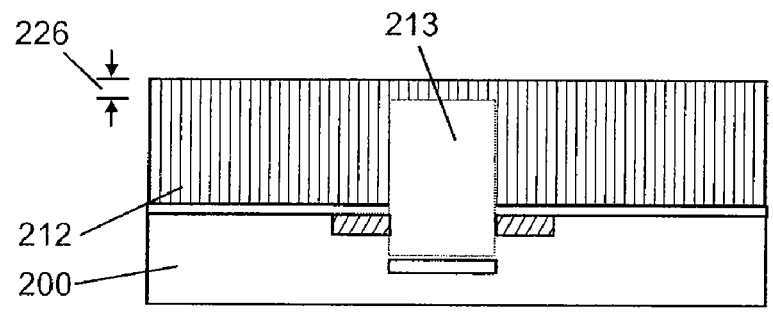
Figure 2J:
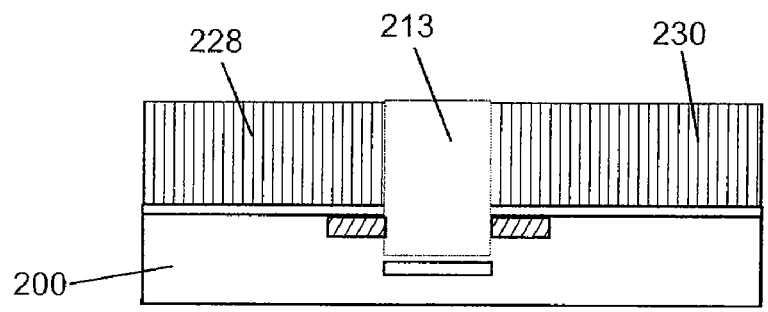

As shown in FIG. 2(i)-2(j), the method includes planarizing the polysilicon material and exposing a portion of the isolation structure using a planarizing process according to an embodiment of the present invention. The planarizing process includes a multi-step chemical mechanical polishing process in a preferred embodiment. The multi-step chemical mechanical polishing process includes a first chemical mechanical polishing step, a second chemical mechanical polishing step, and a third chemical mechanical polishing step. The first chemical mechanical polishing step planarizes the conformal polysilicon material and a leaves a thickness 226 on top of the isolating structure 213 as shown in FIG. 2(i). Thickness 226 ranges from 200 Å to 400 Å in certain embodiments. The first chemical mechanical polishing step includes a low selectivity chemical mechanical polishing process using a hard pad operating at a medium down force, at a medium table speed, and at a low head rotating speed. In a specific embodiment, the medium down force is between 2 pounds per square inch and 4 pounds per square inch, the medium table speed is less than 70 revolutions per minute and the low head rotating speed is less than 70 revolutions per minute. The second chemical mechanical polishing process uses a high selectivity chemical mechanical polishing process to expose a portion of the isolation structure. The high selectivity chemical mechanical polishing process uses the oxide material in the trench region as a stop. The high selectivity chemical mechanical polishing process includes using a low down force of less than 2.0 pounds per square inch, a low table speed of less than 35 revolutions per minute, and a low head rotary speed of less than 35 revolutions per minute in a specific embodiment. The third chemical mechanical polishing process uses an over polishing process to remove all the polysilicon material on the isolation structure as shown in FIG. 2(j). As shown, a top surface of the oxide material is exposed and substantially even with the polysilicon material. The over polishing process includes using a hard pad, a low down force of less than 2.0 pounds per inch, a low table speed of less than 35 revolutions per minute, and a low head rotary speed of less than 35 revolutions per minute in a specific embodiment. Of course there can be other variations, modifications, and alternatives.

The multi-step polishing process eliminates polysilicon line dishing in cell area, improves within wafer polysilicon thickness uniformity and improves polysilicon thickness control. Of course there can be other variations, modifications, and alternatives.

Figure 2K:
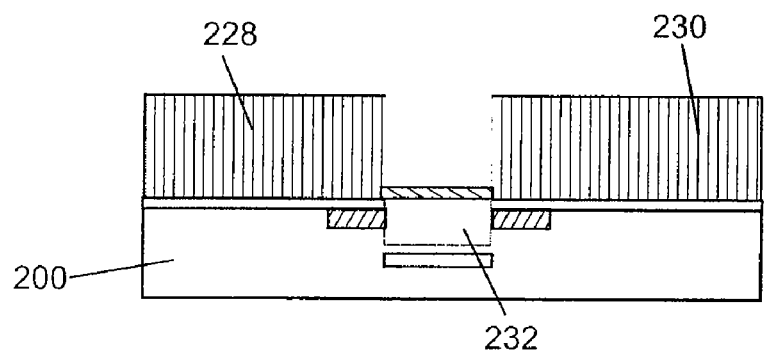

The method includes a selective oxide etching process to remove a portion of the isolation material, forming gate structures 228 and 230. The gate structures are separated by the isolation structure as shown in FIG. 2(k). In a specific embodiment, the selective etching process includes a wet etch using a buffered hydrofluoric acid species. Other suitable selective oxide etching process such as a reactive ion etch may also be used depending on the application. In a preferred embodiment, the gate structures are floating gate structures for a Flash memory device.

Figure 3:
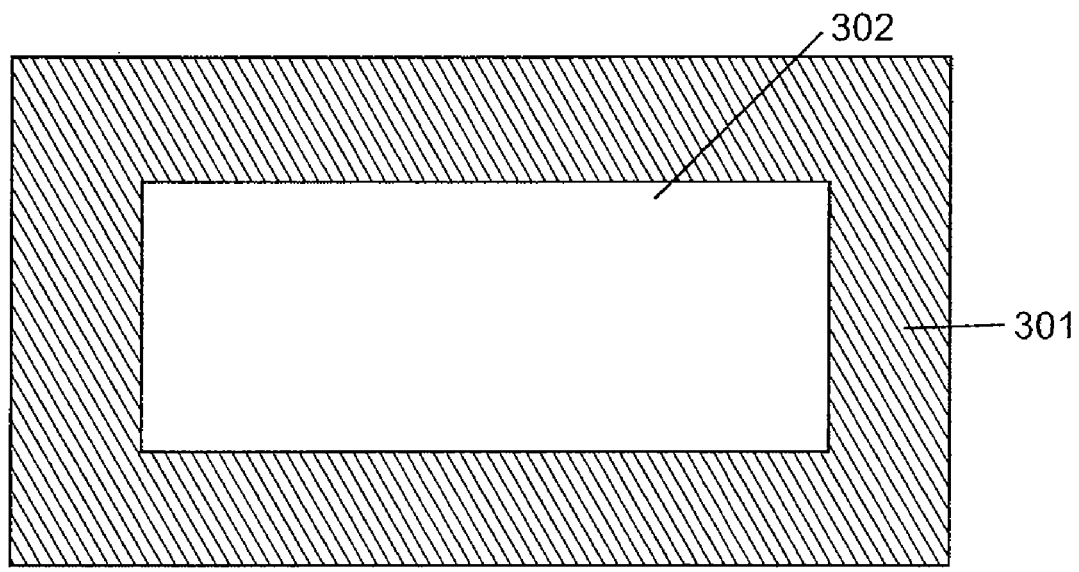
FIG. 3 is a simplified top view diagram of cell region according to an embodiment of the present invention.

In a specific embodiment, the method also includes forming a plurality of dummy structures in a peripheral area 301 as shown in FIG. 3. The peripheral area surrounds memory cell region 302. The dummy structures reduces erosion of oxide material in the isolation structure during multi-step chemical mechanical polishing process. Of course there can be other variations, modifications, and alternatives.

Although the above has been illustrated according to a specific embodiment, there can be other modifications, alternatives, and variations. It is understood that the embodiments and examples described herein are for illustrative purposes only and that various modifications or changes in light thereof will be suggested to person skilled in the art and are to be included with the spirit and purview of this application and scope of the appended claims.

Experiment:

We performed experiments to provide results for the preferred method according to present invention. These experiments are merely examples, which should not unduly limit the scope of the claims herein. One of ordinary skill in the art would recognize many variations, alternatives, and modifications. Further details of such experiments are provided throughout the present specification and more particularly according to the figures below.

The experiments were performed using conventional tools and a desire to discover improved semiconductor processes for fabricating semiconductor integrated circuits. As continued critical dimension shrinking requires tight controls of lithography process, misalignment of photomask often results in defects and device failure. Here, a self-alignment process was used in gate formation, eliminating a lithography step that is prone to misalignment. In addition, global planarization in polysilicon using CMP process causes defects such as polysilicon dishing and erosion of isolation material. A multi-step polysilicon was implemented and greatly reduced defects as seem in convention one step polysilicon CMP process.

Figure 4:
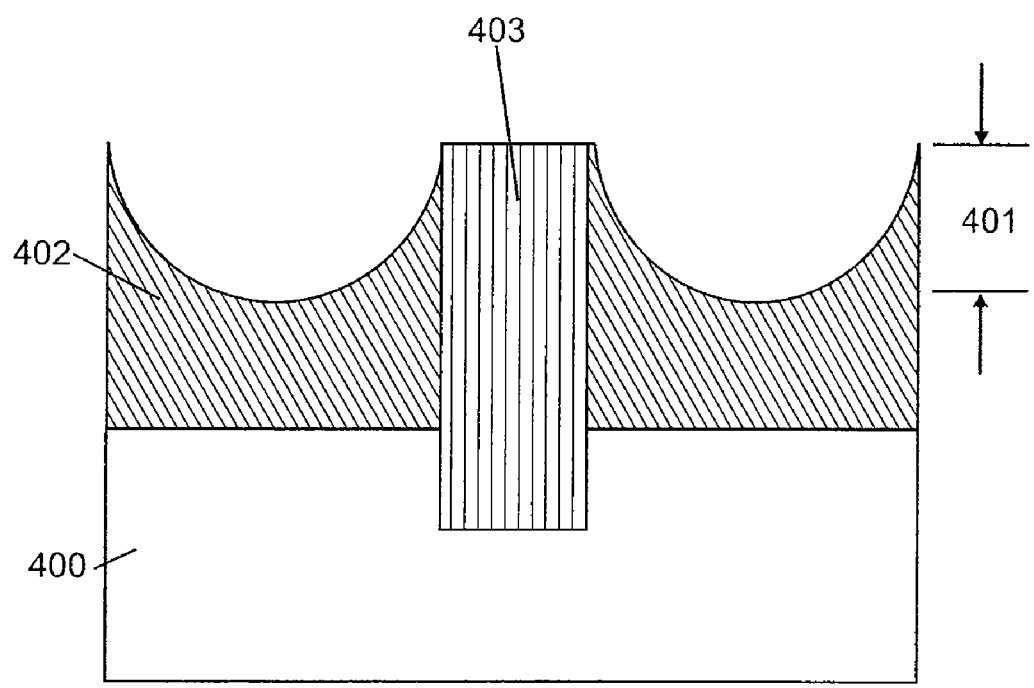
FIG. 4 is a simplified diagram of a gate structure according to a conventional method of manufacturing an integrated circuit.
Figure 5:
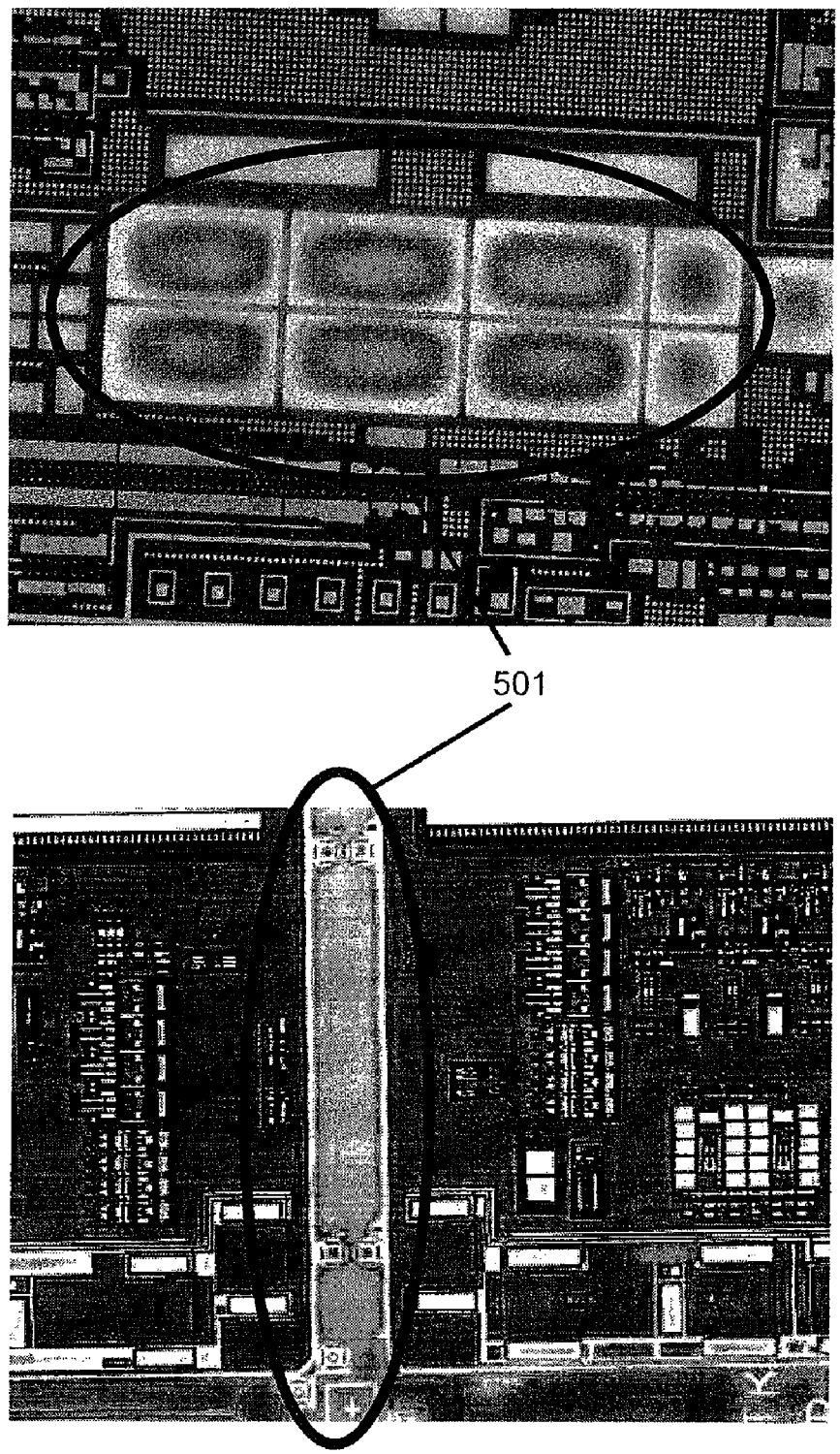
FIG. 5 is a scanning electron micrograph of a device structure according to a conventional method of manufacturing an integrated circuit.
Figure 5B:
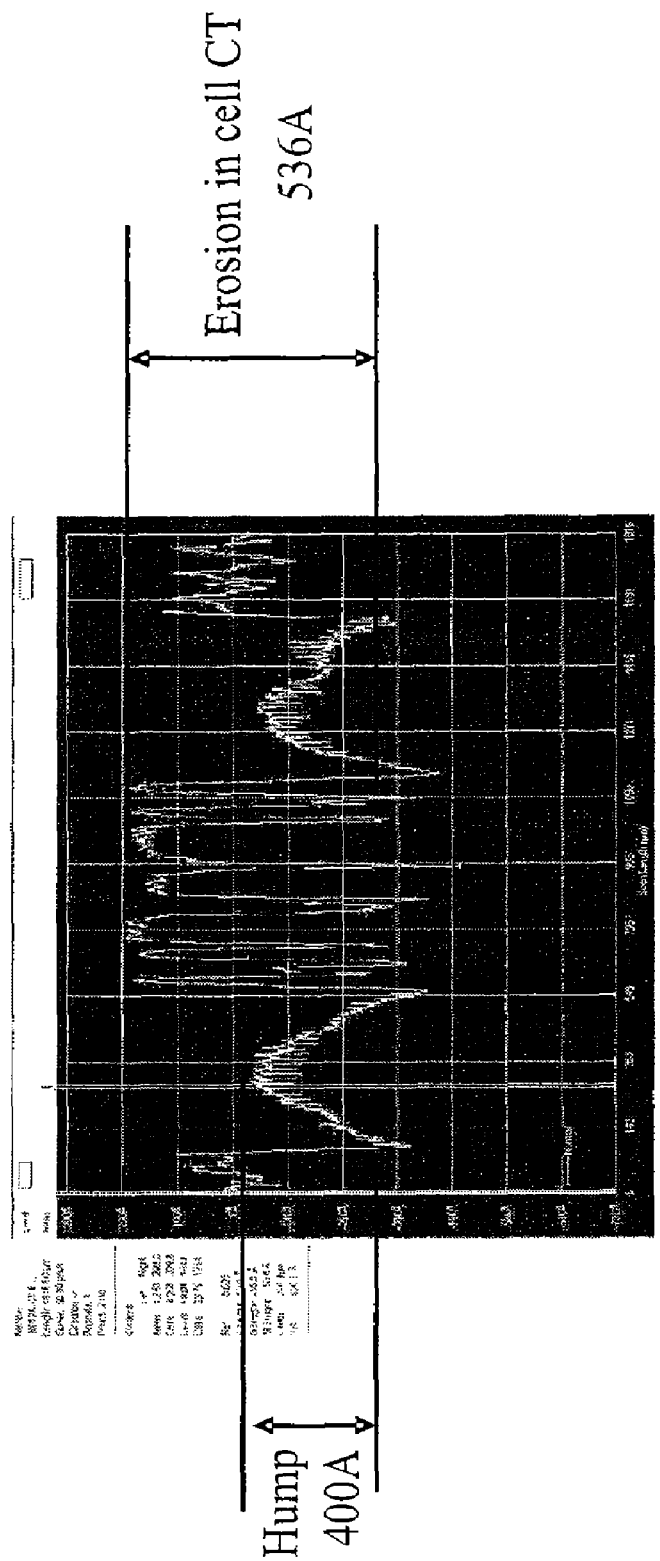

FIG. 4 illustrates polysilicon line dishing defect in cell region when a conventional CMP process is used in polysilicon gate formation. A semiconductor substrate 400 is shown. Polysilicon dishing 401 can range from 200 Å to 300 Å in polysilicon gate structure 402 separated by an isolation structure 403. Polysilicon dishing defect is even more severe in non-cell region or large polysilicon area 501 as shown in scanning electron microscope picture in FIG. 5. Polysilicon dishing in large polysilicon area with area size of 100×100 $\mu m^2$ can be greater than 1500 Å.

Figure 6:
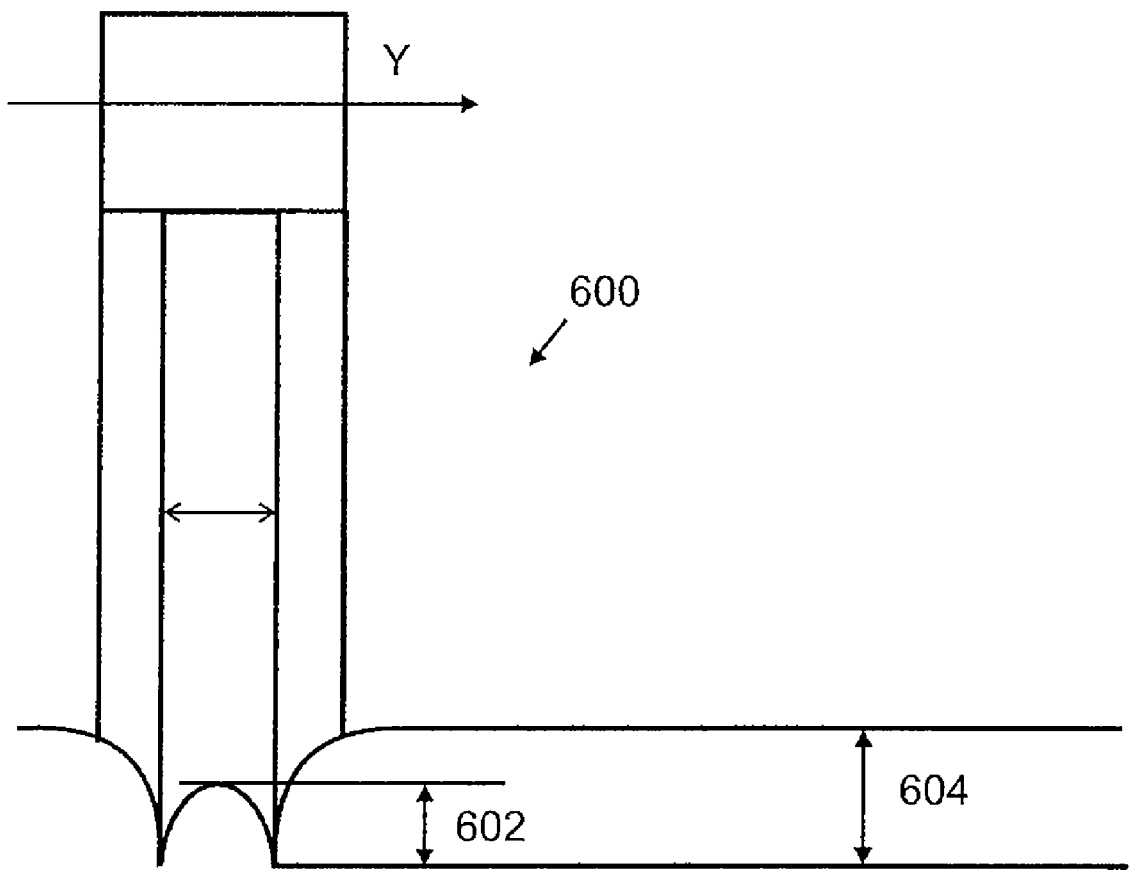
FIG. 6 is a profiler scan of a device structure according to a conventional method of manufacturing an integrated circuit.

Another source of defects come from isolation structure erosion in the cell region during conventional polysilicon CMP process. FIG. 6 illustrates erosion 600 of the isolation structure. The defect shows a hump 602 of about 200-400 Å in height and an erosion 604 of about 400-700 Å in the isolation structure when a conventional polysilicon CMP is used.

Figure 7:
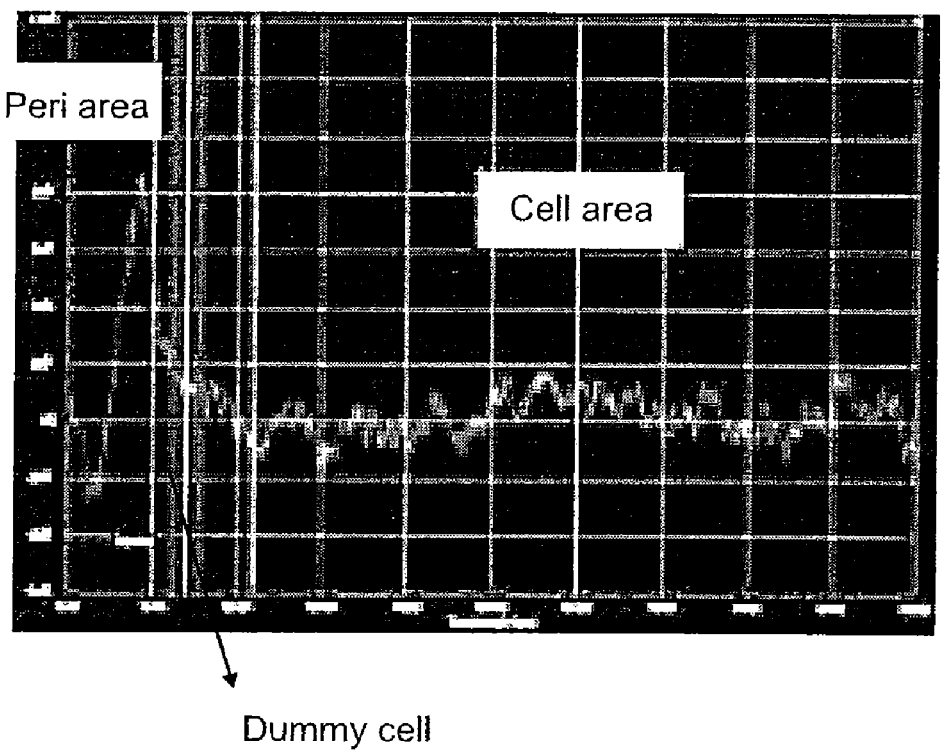
FIG. 7 is a profiler scan of a device structure using a preferred method according to an embodiment of the present embodiment.

Referring to FIG. 7 which shows profiler scans of an isolation structure using the preferred method according to the present invention. As shown in FIG. 7, erosion in isolation region was reduced to about 80 Å or less after multi-step polysilicon CMP process in preferred embodiment.

Figure 8:
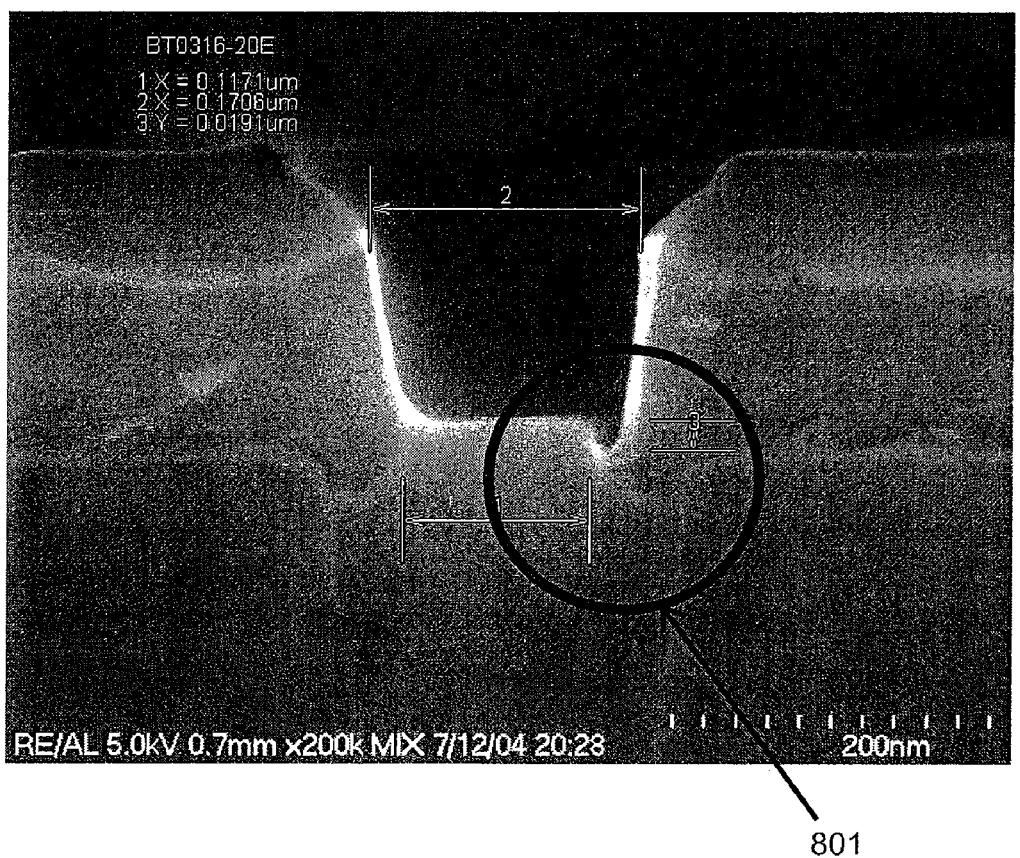
FIG. 8 shows a scanning electron micrograph of a gate structure according to a conventional method of manufacturing an integrated circuit.

Scanning electron micrograph of a polysilicon gate structure fabricated using a conventional method is shown in FIG. 8. As shown, a misalignment of photomask or hard mask in polysilicon gate formation resulted in misalignment in polysilicon etch 801 and device defect. In contrast, such defects were eliminated as no photomask is needed for forming self-aligned polysilicon gate according to embodiments of present invention.

It is also understood that the examples and embodiments described herein are for illustrative purpose only and that various modifications or changes in light thereof will be suggested to persons skilled in the art and are to be included within the spirit and purview of this application and scope of the appended claims

What is claimed is:

1. A method of fabricating an integrated circuit device, the method comprising:

providing a semiconductor substrate, the substrate comprising a surface region;

forming a pad oxide layer overlying the surface region, the pad oxide layer having a pad oxide surface region;

forming a silicon nitride layer overlying the pad oxide layer;

forming a trench region extending through an entirety of a portion of the silicon nitride layer and extending into a depth of the semiconductor substrate;

filling the trench region with an oxide material using a plasma deposition process, the oxide material extending from a bottom portion of the trench region to a vicinity of an upper surface region of the silicon nitride layer;

selectively removing the silicon nitride layer to cause formation of an isolation structure, the isolation structure extending from the bottom portion of the trench region to a height above the pad oxide surface region;

stripping the pad oxide layer;

forming a tunnel oxide overlying the surface of the semiconductor substrate;

depositing a conformal layer of polysilicon material overlying the isolation structure including the tunnel oxide structure; and planarizing the polysilicon layer to expose a top portion of the isolation structure and form a first electrode structure and a second electrode structure separated by a portion of the isolation structure, comprising:

performing a low selectivity chemical mechanical polishing process to remove a thickness of the polysilicon material;

performing a high selectivity chemical mechanical polishing process to expose a portion of the isolation material; and performing an over polishing process once a portion of the isolation material has been exposed.

2. The method of claim 1 wherein the low selectivity chemical mechanical polishing process uses a hard pad, medium table speed, and low head rotating speed.

3. The method of claim 2 wherein the medium table speed is less than 70 revolutions per minute.

4. The method of claim 3 wherein the head rotating speed is less than 70 revolutions per minutes.

5. The method of claim 1 wherein the low selectivity chemical mechanical polishing process and the over polishing process use a down force of less than 2 pounds per square inch.

6. The method of claim 1 wherein the low selectivity chemical mechanical polishing process and the over polishing process use a table speed of less than 35 revolutions per minute and a head rotating speed of less than 35 revolutions per minute.

* * * * *